United States Patent
Sharma et al.

(10) Patent No.: US 7,233,176 B2
(45) Date of Patent: Jun. 19, 2007

(54) CMOS INPUT BUFFER AND A METHOD FOR SUPPORTING MULTIPLE I/O STANDARDS

(75) Inventors: Manoj Kumar Sharma, New Delhi (IN); Rajat Chauhan, Uttaranchal (IN)

(73) Assignee: STMicroelectronics Pvt. Ltd., Uttar Pradesh (IN)

( * ) Notice: Subject to any disclaimer, the term of this patent is extended or adjusted under 35 U.S.C. 154(b) by 144 days.

(21) Appl. No.: 11/021,561

(22) Filed: Dec. 23, 2004

(65) Prior Publication Data

US 2005/0168246 A1 Aug. 4, 2005

(30) Foreign Application Priority Data

Dec. 26, 2003 (IN) ............... 1622/Del/2003

(51) Int. Cl.
   H03K 5/153 (2006.01)
   H03B 1/00 (2006.01)
(52) U.S. Cl. ............... 327/78; 327/89; 327/108; 326/83; 326/86
(58) Field of Classification Search ............... None
   See application file for complete search history.

(56) References Cited

U.S. PATENT DOCUMENTS 5,488,322 A * 1/1996 Kaplinsky ............... 327/74
6,049,229 A * 4/2000 Manohar et al. ............... 326/83
6,590,432 B1 * 7/2003 Wu et al. ............... 327/108
6,693,458 B1 * 2/2004 Barrow ............... 326/82
6,864,725 B2 * 3/2005 Cowles et al. ............... 327/108

* cited by examiner

Primary Examiner—Tuan T. Lam
(74) Attorney, Agent, or Firm—Lisa K. Jorgenson; E. Russell Tarleton; Seed IP Law Group PLLC

(57) ABSTRACT

A CMOS input buffer supporting multiple I/O standards and having a pair of NMOS and PMOS differential receivers, each having a first input connected to an input pad and a second input connected to a reference voltage, a first multiplexer connected to the control terminal of the current sink of the NMOS differential receiver and having one input connected to the positive supply terminal, and a second multiplexer connected to the control terminal of the current source of the PMOS differential receiver and having one input connected to the negative supply terminal or ground. The buffer further includes an inverter connected to a combined output of the PMOS and NMOS differential receivers and having an output connected to the second input of the first and second multiplexer, and a configuration storage bit for selecting the desired inputs of the first and second multiplexer, thereby supporting high speed standards as well as general purpose standards while reducing static power dissipation.

22 Claims, 15 Drawing Sheets

CMOS INPUT BUFFER AND A METHOD FOR SUPPORTING MULTIPLE I/O STANDARDS

BACKGROUND OF THE INVENTION

1. Field of the Invention

This invention relates to an input buffer architecture. More particularly, it relates to a CMOS input buffer and a method for supporting multiple I/O standards.

2. Description of the Related Art

Field Programmable Gate Arrays (FPGA) are frequently used for various applications and are therefore, interfaced with various devices operating at varied interfacing standards (e.g., LVTTL, LVCMOS, LVCMOS2, LVCMOS1.8, 1.5, 1.2, HSTL, SSTL, GTL, GTL+ etc.). Due to the vast and diverse field of applications of FPGAs, it becomes desirable to have their input circuits capable of receiving signals of different voltage swings in conformance with interfacing standards and convert them into core-acceptable voltage swings.

Existing input circuits for FPGAs use multiple input buffers, each designed to support one or more compatible interface standards. Output of a desired input buffer is selected from a multiplexer and connected to the core. Such an input circuit shown in FIG. 1 includes an input circuit 199, which includes three input receivers 150, 140, 141 and a multiplexer 160. Input receiver 150 is a Schmitt trigger having its input connected to an input pad 180 and having an output 190 connected to one of the inputs of multiplexer 160. The input receiver 150 is structured to accept input voltage swings in general purpose interface environments like LVTTL, LVCMOS, LVCMOS2, LVCMOS1.8, LVCMOS1.5, and LVCMOS1.2.

Input receivers 140 and 141 are NMOS type and PMOS type differential input receivers, respectively, each having one of their input coming from the input pad 180 and the other input connected to the reference voltage VREF. Their outputs 191 and 192 are also connected to one of the inputs of the multiplexer 160. The input receiver 140 is compatible with input interface standards requiring higher reference voltages, like SSTL3 and SSTL2. The other input receiver 141 is compatible with input interface standards requiring lower reference voltages, like HSTL, GTL and GTLP.

FIGS. 2(a), 3 and 4 show the internal circuitry of the input receivers 150, 140 and 141 respectively. For ease of understanding, enable circuitry from each of the receivers is removed. Detailed explanation of the prior art can be found in U.S. Pat. No. 5,958,026 titled "Input/Output Buffer Supporting Multiple I/O Standards".

In the method employed in the existing input circuitry for FPGAs as shown in FIGS. 1–4, the first difficulty is with designing the Schmitt trigger. It is very difficult to design a Schmitt trigger that supports number of general purpose standards. This is because supporting a number of general purpose standards requires that maximum input voltage for logic low ($V_{ilmax}$) and minimum input voltage for logic high ($V_{ihmin}$) of the Schmitt trigger be kept such that they satisfy $V_{ilmax}$ and $V_{ihmin}$ specifications of all the desired standards. In effect of this, maximum and minimum limits within which Schmitt trigger's trip point must remain, becomes tighter, and therefore variation in operating conditions (PVT) easily makes the trip point to move outside the limits. So a Schmitt trigger that supports one standard nicely may not be working well for other desired standards.

For an example, a Schmitt trigger shown in FIG. 2(a) is sized to support general-purpose standards, namely, 5V CMOS, LVTTL, LVCMOS, LVCMOS-2.5V, LVCMOS-1.8, LVCMOS-1.5V and LVCMOS-1.2V. The limits for its trip-point variation for a given standard are set by $V_{ilmax}$ and $V_{ihmin}$ specification of the standard. Table 1 shows the $V_{ihmin}$ and $V_{ilmax}$ specifications of the desired standards. It is to be noted that power supply VCCI of the Schmitt trigger 150 can vary with standard, which is also specified in Table 1. For details JEDEC standard of corresponding general purpose standard can be referred.

TABLE 1

| Standards | Vilmax | Vihmin | VCCI |
|---|---|---|---|
| 5 V CMOS | 1.0 | 3.5 | 3.3 |
| LVTTL | 0.8 | 2.0 | 3.3 |
| LVCMOS | 0.8 | 2.0 | 3.3 |
| LVCMOS-2.5 V | 0.7 | 1.7 | 2.5 |
| LVCMOS-1.8 V | 0.63 | 1.17 | 1.8 |
| LVCMOS-1.5 V | 0.52 | 0.97 | 1.5 |
| LVCMOS-1.2 V | 0.42 | 0.78 | 1.2 |

FIGS. 2(b) through 2(d) show the variation in trip point of a Schmitt trigger with different operating conditions for general-purpose standards. All the characteristic curves of Schmitt trigger 150 are plotted for the output 190 against the input 197. Each figure has three curves, one at a typical condition while other two are at extreme conditions, SF (Slow models for NMOS, Fast Models for PMOS, temperature and power supply are best) and FS (Fast models for NMOS, Slow models for PMOS and temperature and supply voltage are the worst).

FIG. 2(b) shows Schmitt trigger's characteristic curves for a nominal 3.3 volt VCCI supply. In this case, Schmitt trigger supports 5V CMOS, LVTTL and LVCMOS standards. Curve 3.3_typ is plotted for typical operating conditions and curves 3.3_fs and 3.3_sf are plotted for two extreme operating conditions. It can be seen that extreme curves are within the $V_{ihmin}$ and $V_{ilmax}$ limits marked in the figure. So in this case, the Schmitt trigger is operating within the specifications of 5V CMOS, LVTTL and LVCMOS standards.

FIG. 2(c) shows Schmitt trigger's characteristic curves for nominal 2.5 volt and 1.8V VCCI supplies supporting LVCMOS-2.5V, LVCMOS-1.8V standards respectively. Similar to FIG. 2(b), curves for typical and extreme operating conditions are plotted. In the case of LVCMOS-2.5V, extreme curves are within the $V_{ihmin}$ and $V_{ilmax}$ limits but for the LVCMOS-1.8V case extreme curves move outside the $V_{ihmin}$ and $V_{ilmax}$ limits. So in this case, the Schmitt trigger is operating within the specifications of LVCMOS-2.5V but violates the specifications of LVCMOS-1.8V.

FIG. 2(d) shows Schmitt trigger characteristic curves for nominal 1.5 volt and 1.2V VCCI supplies supporting LVCMOS-1.5, LVCMOS-1.2 standards respectively. Similar to FIG. 2(c), curves for typical and extreme operating conditions are plotted. Here both LVCMOS-1.5V and LVCMOS-1.2V, extreme curves move outside the $V_{ihmin}$ and $V_{ilmax}$ limits. So in this case the Schmitt trigger violates specifications of both LVCMOS-1.5V and LVCMOS-1.2V standards.

From the example, it is apparent that a Schmitt trigger designed to support a number of general-purpose standards, supports some of the standards nicely but violates specification of others. It is also to be noted that, even though performing within the specification, a large variation in trip point is not desirable, as it will be affecting the duty cycle and the quality of the signal.

Secondly, it is desirable to have a single input receiver circuitry capable of supporting most of the interfacing standards, instead of having a number of receivers in parallel and then selecting the output of the desired one.

BRIEF SUMMARY OF THE INVENTION

The disclosed embodiments of the present invention provide a CMOS input buffer supporting multiple IO standards having reduced layout area. It is desired to provide an input buffer that supports general-purpose logic inputs as well as high-speed inputs. In addition, a circuit is provided that generates the reference voltage for the case of general-purpose standards internally.

Optimally, the disclosed embodiments provide a circuit that reduces variations in the receiver's trip point with varying operating conditions as the reference voltage is generated internally, and to provide a circuit whose frequency of operation is highly improved. Ideally, the duty cycle and quality of the signal are maintained.

In accordance with one embodiment of the present invention, a CMOS input buffer supporting multiple I/O standards is provided that includes a pair of NMOS and PMOS differential receivers each having one input connected to the input pad and the second input connected to a reference voltage; a first multiplexer connected to the control terminal of the current sink of said NMOS differential receiver, having one input connected to the negative supply terminal/ground; a second multiplexer connected to the control terminal of the current source of said PMOS differential receiver, having one input connected to the positive supply terminal; an inverter connected to the combined output of said PMOS and NMOS differential receivers having its output connected to the second input of said first and second multiplexer; and a configuration storage bit for selecting the desired inputs of said first and second multiplexer, thereby supporting high speed standards as well as general purpose standards, while reducing static power dissipation.

The CMOS input buffer in accordance with the foregoing embodiment preferably supports an internally generated reference voltage, and it supports FPGA and other programmable devices.

The said PMOS and NMOS differential receivers are configured to support general purpose standards to minimize static power dissipation and reduce susceptibility to different processes and conditions.

In accordance with another embodiment of the present invention also provides a method for supporting multiple IO standards for a CMOS input buffer that includes the steps of applying the input signal simultaneously to one input of an NMOS and a PMOS differential receiver; supplying a reference voltage to the second input of each of said NMOS and said PMOS differential receiver; combining and inverting the outputs of said NMOS and said PMOS differential receivers; multiplexing the control input of the current sink/source of each of said NMOS and said PMOS differential receiver between a supplied positive/negative supply voltage and said inverted output; and selecting the supplied positive/negative supply voltage in case of high-speed interface, while selecting said inverted output for standard logic signal.

In accordance with another embodiment of the invention, an input buffer is provided that includes a signal input to receive an input signal; a reference voltage input to receive a reference voltage; an output node to receive output signals; a control circuit configured to generate a control signal to select whether the input buffer will support one of general purpose standards and high speed standards; a first differential amplifier coupled to the signal input, to the reference input, and to the output node, a control input coupled to an output of the control circuit, and a feedback input coupled to an output terminal that is coupled to the output node; and a second differential amplifier coupled to the signal input, to the reference input, and to the output node, a control input coupled to an output of the control circuit, and a feedback input coupled to an output terminal that is coupled to the output node.

In accordance with another embodiment of the invention, a circuit for interfacing devices operating at various standards and speeds is provided that includes at least one input buffer that includes first and second differential amplifiers each having a first input for receiving an input signal and a second input for receiving a reference voltage, and a control input for receiving a control signal, the first and second differential amplifiers functioning as conventional differential comparator to support high speed standards in response to a control signal at a first level and configured to support general standards in response to the control signal at a second level.

In accordance with another embodiment of the invention, a method for interfacing devices operating at various speeds and standards is provided that includes receiving an input signal at first and second differential amplifiers; receiving a reference voltage at each of the first and second differential amplifiers; combining and inverting the outputs of the first and second differential amplifiers and feeding back the combined inverted outputs to the first and second differential amplifiers; and generating a control signal to the first and second differential amplifiers to operate as a conventional differential comparator to support high speed standards when the control signal is at a first level and to operate as differential amplifiers in support of general interfacing standards for a standard logic signal when the control signal is at a second level.

BRIEF DESCRIPTION OF THE SEVERAL VIEWS OF THE DRAWINGS

The disclosed embodiments of the present invention will now be described with reference to the accompanying drawings, wherein:

FIG. 2($b$) to FIG. 2($d$) show the dc characteristics of the Schmitt trigger of FIG. 2($a$).

FIG. 8($b$) to FIG. 8($d$) show the dc characteristics of an input buffer of the present invention.

DETAILED DESCRIPTION OF THE INVENTION

Figure 1:
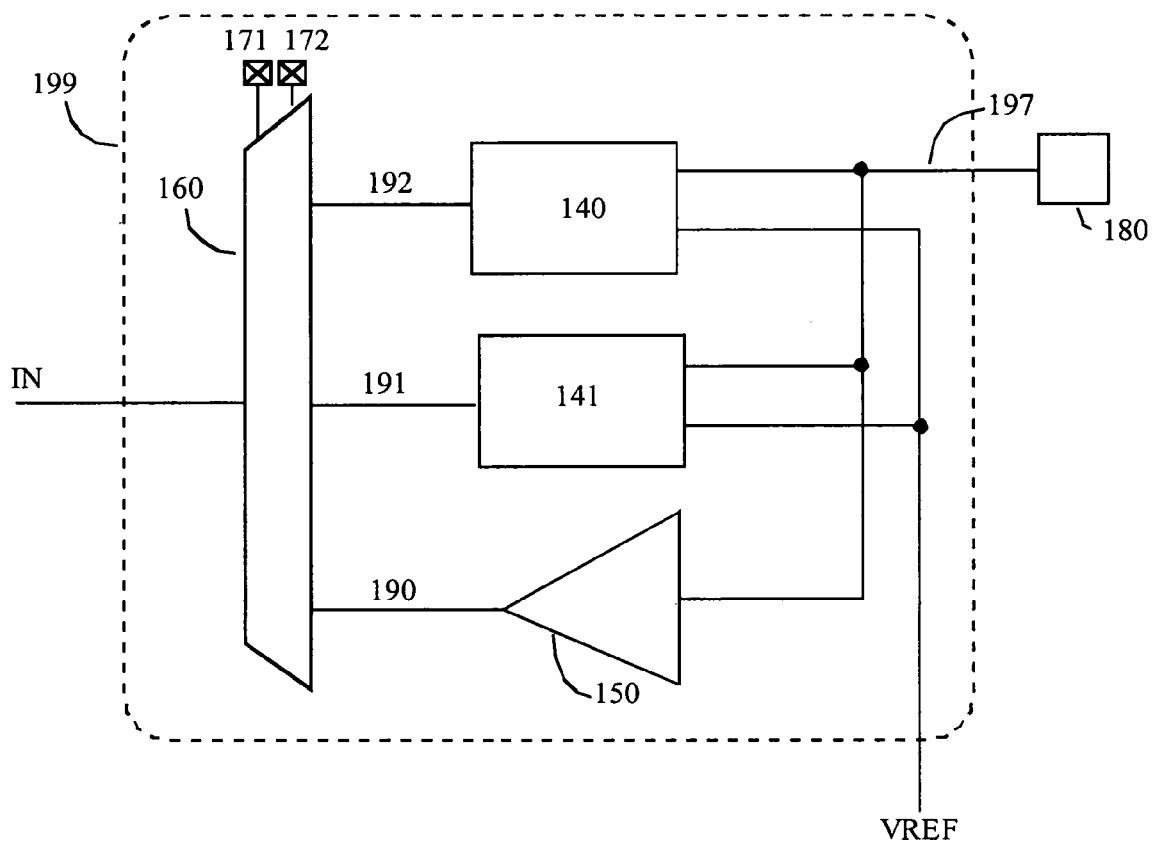
FIG. 1 shows a block diagram of known input buffers.
Figure 2A:
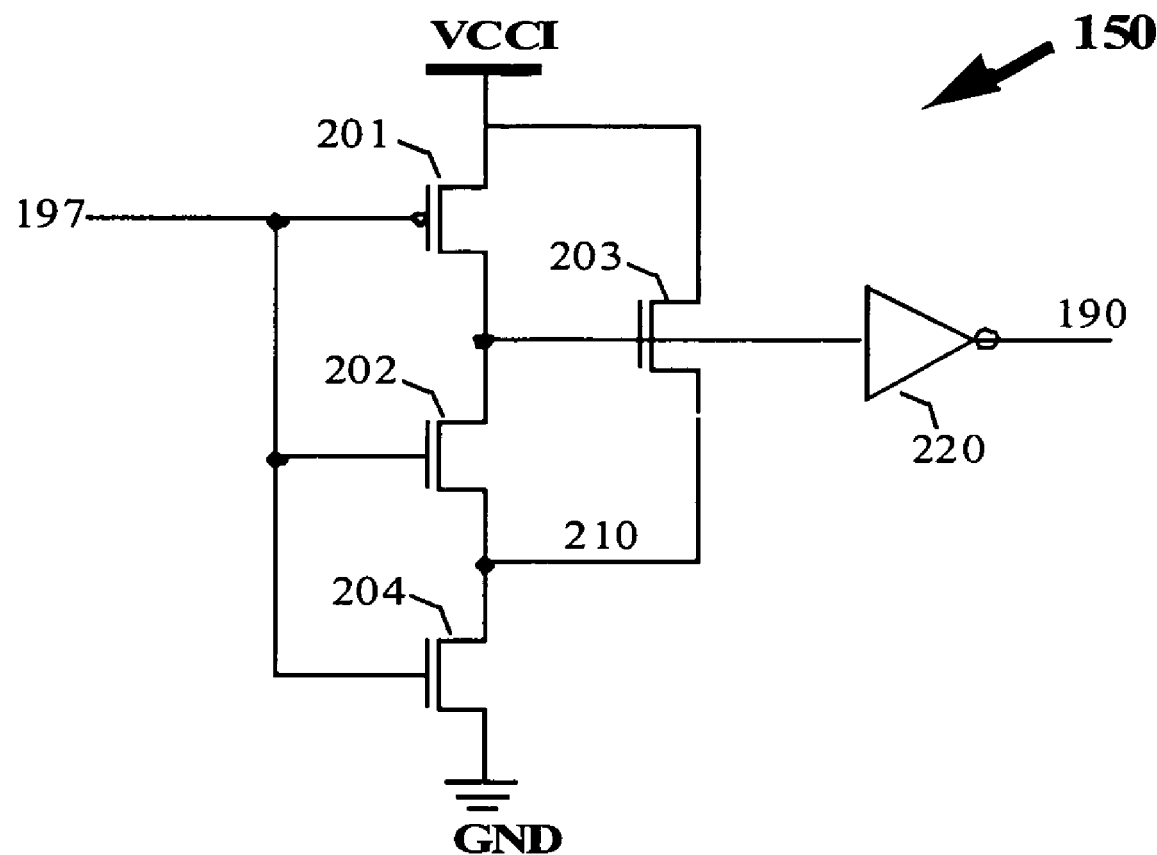
FIG. 2($a$) shows the circuit diagram of a known Schmitt trigger used in a buffer of FIG. 1.
Figure 2B:
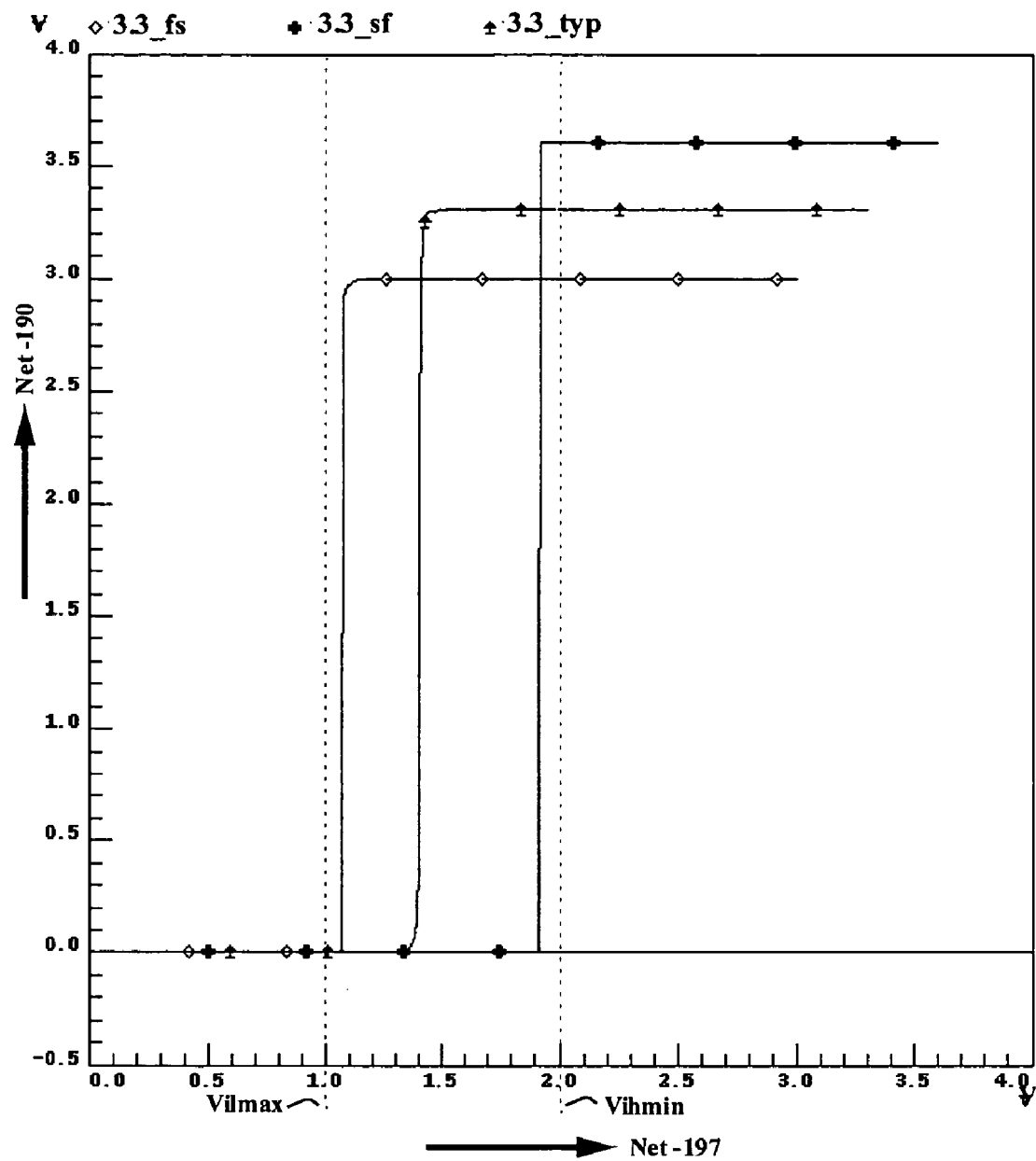
Figure 2C:
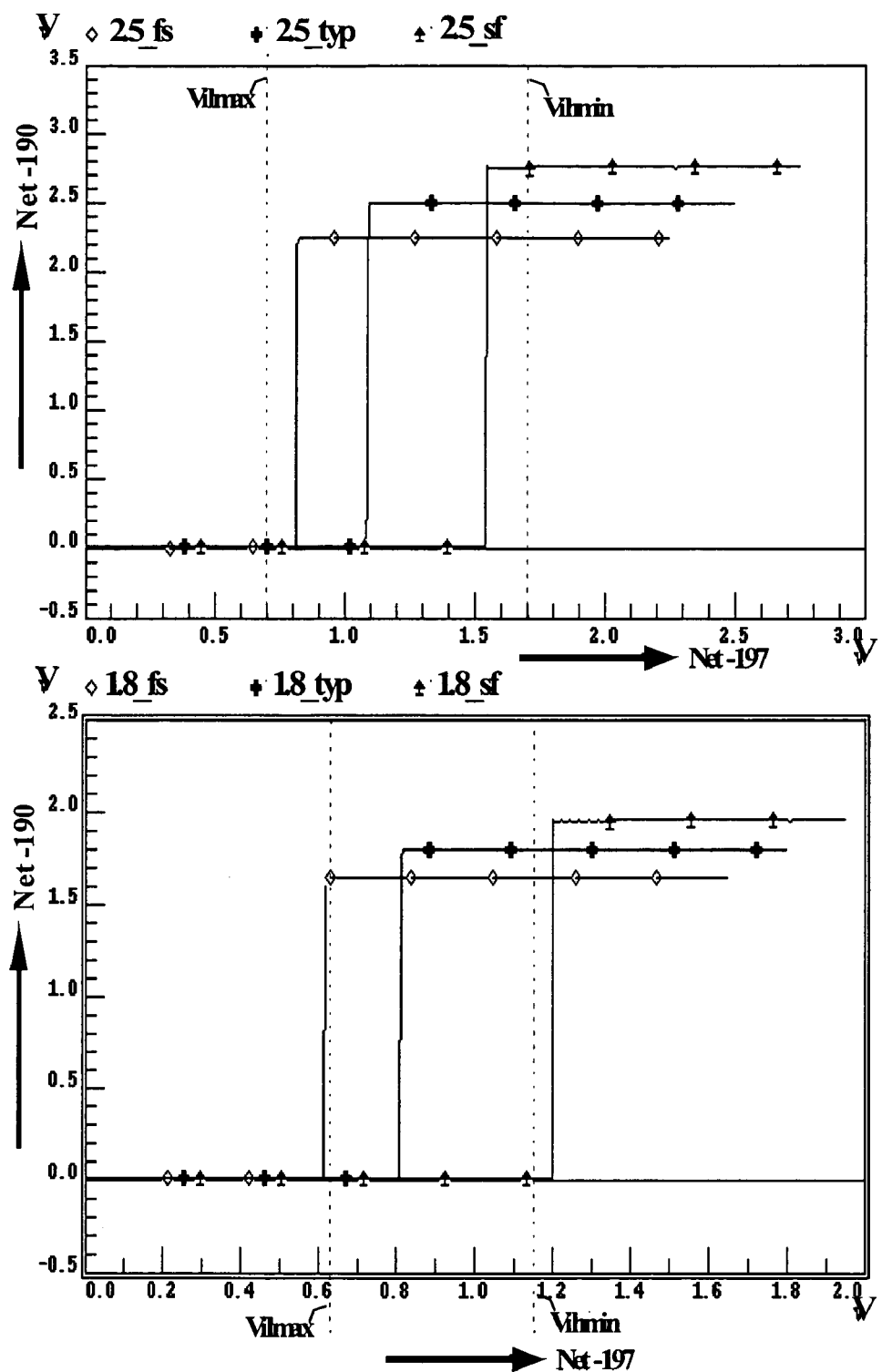
Figure 2D:
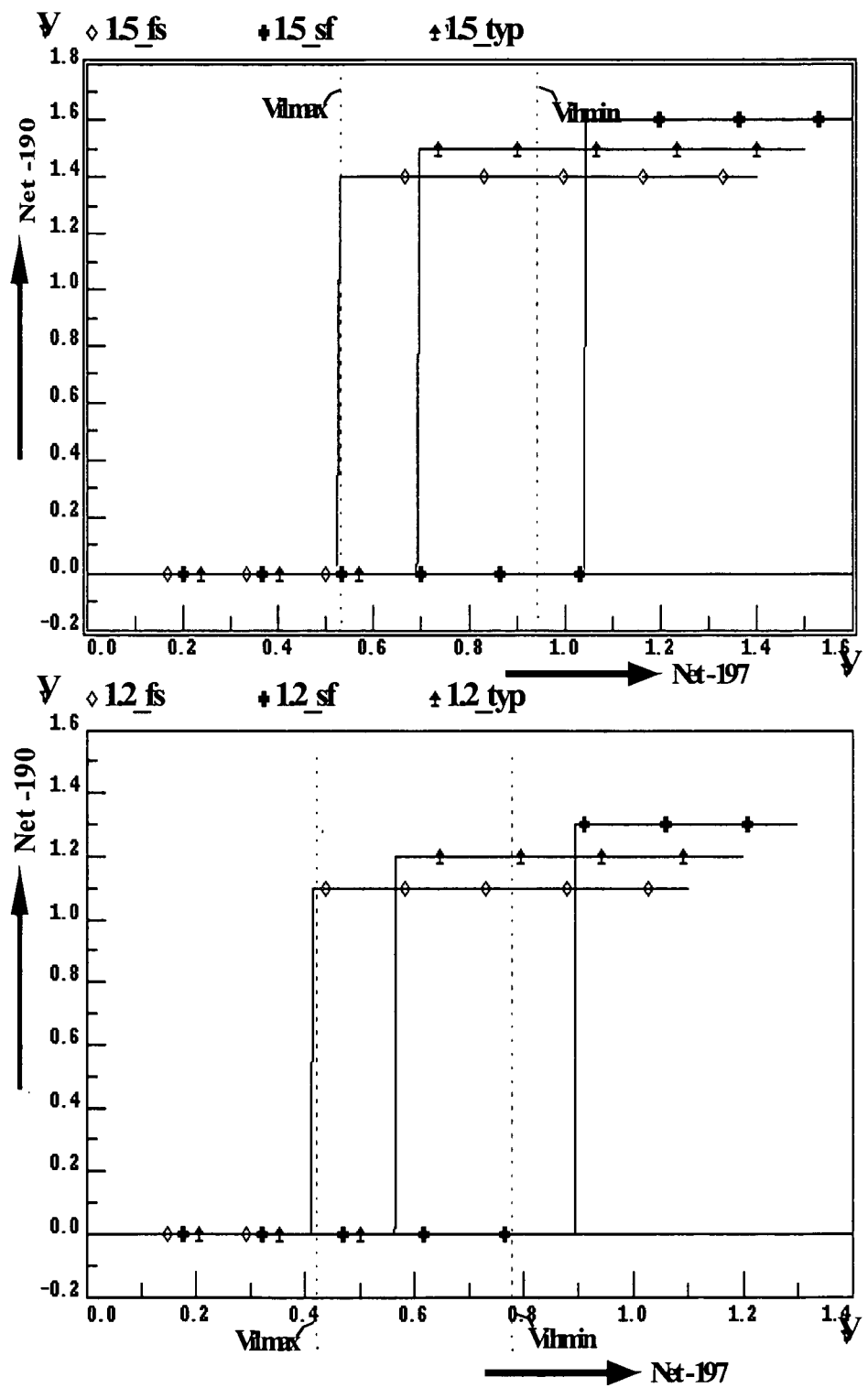
Figure 3:
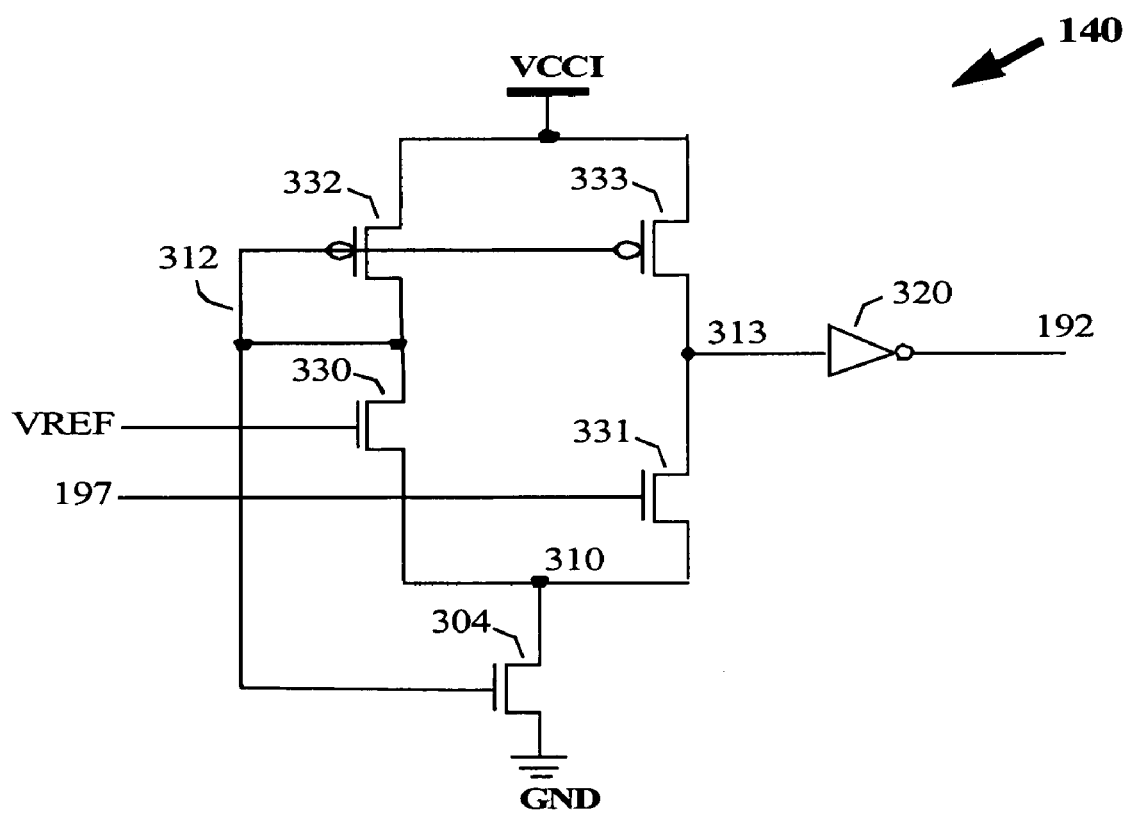
FIG. 3 shows the circuit diagram of an NMOS differential input receiver used in the buffer of FIG. 1.
Figure 4:
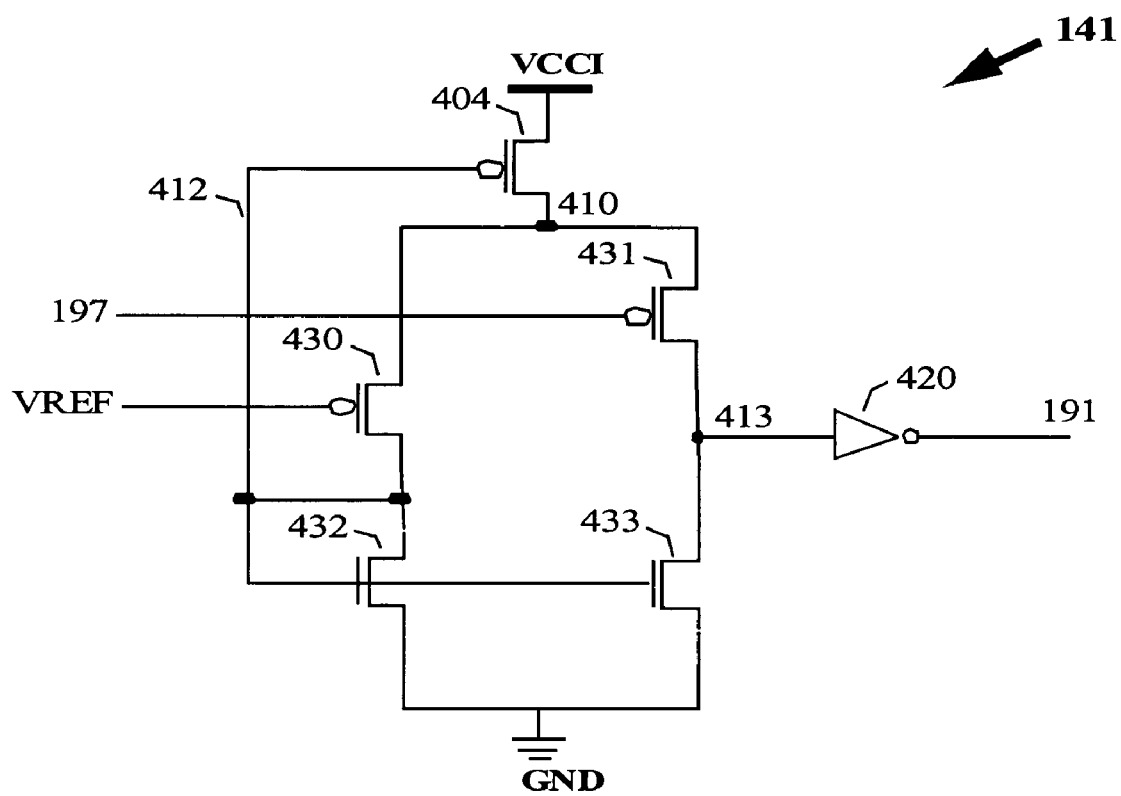
FIG. 4 shows the circuit diagram of a PMOS differential input receiver used in the buffer of FIG. 1.
Figure 5:
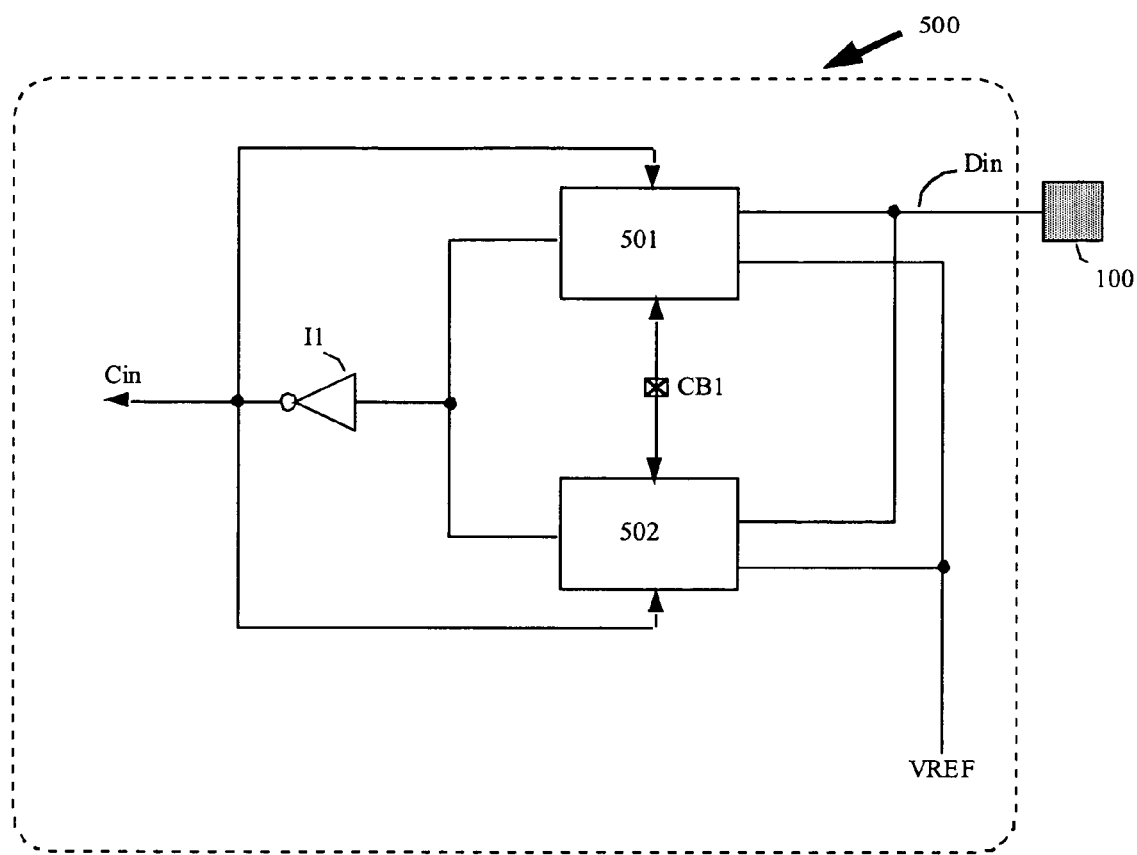
FIG. 5 shows the block diagram of an input buffer in accordance with the present invention.

FIG. 5 shows the block diagram of an input buffer 500 in accordance with the present invention. The block 501 is the NMOS-type differential input receiver while block 502 is the PMOS-type differential input receiver. One of the inputs Din to the differential receivers comes from the input pad 100. The other input is the reference voltage VREF. The output of 501 and 502 are connected together to the input of an inverter I1. The output of the inverter I1 is Cin, which is the input signal to the core. A feedback is taken from the output Cin to blocks 501 and 502. This is required to reduce power dissipation in the differential receivers when operating in a general purpose standards environment. The source of the reference voltage VREF is not shown here, but it can be given externally or can be generated internally within the chip.

The configuration bit CB1 decides whether the input buffer is configured to support general purpose standards like CMOS 5V, LVTTL, LVCMOS, LVCMOS2 etc. or various high speed standards like GTL, GTL+, HSTL, SSTL3, SSTL2 etc.

Figure 6:
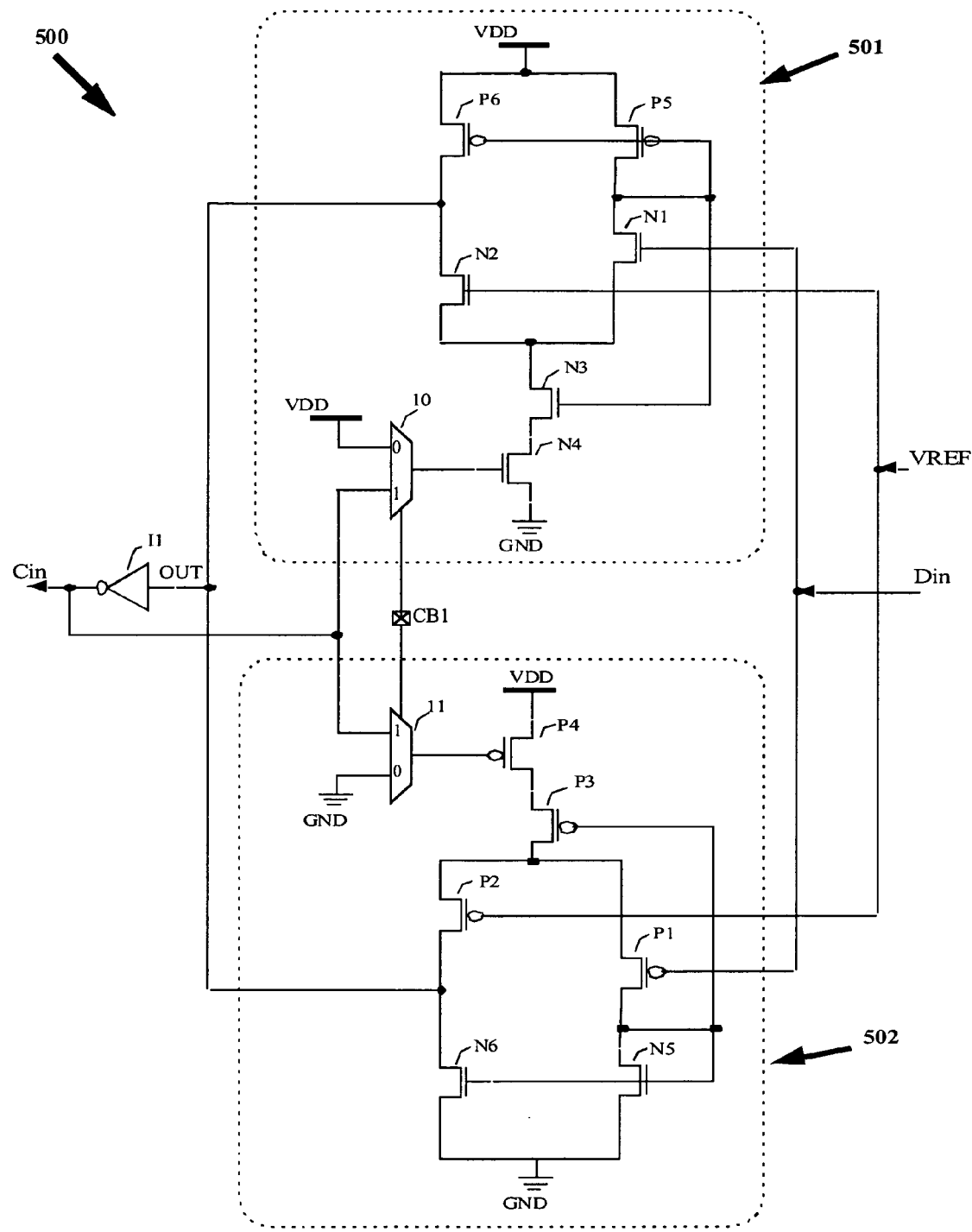
FIG. 6 shows the circuit diagram of an input buffer in accordance with the present invention.

FIG. 6 shows the circuit diagram of the input buffer in accordance with the present invention. In the NMOS differential amplifier of block 501, the gates of NMOS devices N1 and N2 are connected to the two input signals Din and VREF, respectively. The source of N1 and N2 are connected together to the drain of N3. The drains of N1 are connected to the gate of N3 and also to the gates of PMOS devices P5 and P6. The gates of P5 and P6 are connected to the drain of P5 while their sources are connected to VDD. The drain of P6 is connected to the OUT terminal. The drain of N4 is connected to the source of N3, while its source is connected to the ground. The gate of N4 is connected to the output of the multiplexer 10, which passes either VDD, or output of buffer Cin depending on CB1.

In the PMOS differential receiver of block 502, the gates of PMOS P1 and P2 are connected to Din and VREF respectively. The drains of P1 and P2 are connected to the drains of N5 and N6 respectively. The drain of N6 is connected to the OUT terminal of this receiver. The gates of N5 and N6 are connected together to the drain of N5 while their sources are grounded. The source of P1 and P2 are connected together to the drain of P3. The gate of P3 is connected to the drain of N5, while its source is connected to the source of P4. P4 has its source connected to the VDD and gate connected to the output of the multiplexer 11. The multiplexer 11 has the ground and Cin as its input while the configuration bit CB1 is its control signal.

The configuration bit CB1 configures the input buffer to support multiple standards. When CB1=0, it supports various high-speed standards. On other hand when CB1=1, it supports various general-purpose standards.

To understand the operation of the circuit, consider the following cases:

1. CB1=0:

When CB1 is LOW, the output of multiplexer 10 and 11 is VDD and GND respectively. This will make N4 and P4 permanently ON. The two differential receivers 501 and 502 work as a conventional differential comparator.

When Din is greater than VREF, the resistance of N1 decreases while the resistance of P1 increases. This will increase the current through the N1 branch as compared to the N2 branch, and similarly current through the P2 branch becomes higher than in the P1 branch. This will make the Out terminal at a HIGH logic. The inverter I1 helps to achieve the CMOS logic levels. This makes Cin at LOW.

On the other hand, when Din is less than VREF, the resistance of N1 increases while the resistance of P1 decreases. Due to this, the current through branch N1 is less than that in N2 branch and also current through the P1 branch is higher than in the P2 branch. This makes the output OUT at a LOW logic and Cin at a HIGH logic.

Standards that require a lower VREF e.g., HSTL, GTL, GTL+, are implemented in the PMOS differential amplifier of block 502, and in this case the NMOS differential amplifier only assists to improve the logic levels and switching speed. Standards that require a higher VREF e.g., SSTL2, SSTL3 etc., are mainly implemented in the NMOS differential amplifier 501 and the PMOS differential amplifier 502 will help in improving the switching speed and levels of the output.

2. CB1=1

In this mode of operation, the differential amplifiers are configured to support general-purpose standards. Depending upon the general purpose standard to be supported, the reference voltage VREF and power supply VDD of the differential amplifiers are given accordingly. Table 2 below shows the reference voltage and corresponding supply voltage to be given to support the desired standard.

TABLE 2

| Standards | VREF | VDD |
| --- | --- | --- |
| 5 V CMOS | 1.5 | 3.3 |
| LVTTL | 1.5 | 3.3 |
| LVCMOS | 1.5 | 3.3 |
| LVCMOS-2.5 V | 1.25 | 2.5 |
| LVCMOS-1.8 V | 0.9 | 1.8 |
| LVCMOS-1.5 V | 0.75 | 1.5 |
| LVCMOS-1.2 V | 0.6 | 1.2 |

For a full swing CMOS input signal, a continuous static current is flowing through the differential amplifiers in normal configuration, in comparison to zero static current in the Schmitt trigger. To avoid this, the circuit is configured in such a way that power consumed in operation of these standards remains almost the same as that in the case of the Schmitt trigger.

To hold a HIGH logic at the output OUT, the PMOS differential amplifier 502 is used, and at this time the NMOS differential amplifier 501 is cut off. On the other hand, the NMOS differential amplifier 501 holds a LOW logic, and at this moment the PMOS differential amplifier 502 is cut off. This type of operation ensures negligible static current flowing in the differential amplifiers for CMOS and TTL input swings and therefore reduces power dissipation. Detailed explanation of this operation is given in the following text.

When CB1 is HIGH, the output of the multiplexer 10 and 11 is connected to Cin.

Consider the case when Din>VREF. For this, OUT is HIGH and Cin=0. As Cin is LOW, N4 is off while P4 is ON. This puts the NMOS differential amplifier 501 in cut off, and therefore no static current will flow through it.

In the PMOS differential amplifier 502, for full swing input signals applied at input Din, (e.g., for 3.3V supply voltage, the input swing is from 0 to 3.3V) when Din is HIGH, P1 is OFF, which results in a LOW gate voltage (Vtn) at N5 and N6, where Vtn is NMOS's threshold voltage. As N6 is in the sub threshold region, VDD will appear at the drain of N6, which is the OUT terminal. As P1 and N6 are off, negligible static current will flow through PMOS differential amplifier. By this way, HIGH logic is held at the output OUT without any static power dissipation. As OUT is HIGH, Cin is LOW. This keeps N4 OFF and P4 ON.

Similarly, consider the case when Din<VREF. For this, OUT is LOW and Cin is HIGH. As Cin is HIGH, P4 is off while N4 is ON. This makes PMOS differential amplifier 502 cut off, and therefore no static current will flow through it.

In the NMOS differential amplifier 501, for full swing input signals applied at input Din, when Din is LOW, N1 will be OFF. This results in a HIGH gate voltage (VDD-Vtp) at P5 and P6, where Vtp is PMOS's threshold voltage. As P6 is in a sub threshold region, GND will be applied at the drain of P6, which is the OUT terminal. As N1 and P6 are off, negligible static current will flow through NMOS differential amplifier. By this way, a LOW logic is held at the output OUT without any static power dissipation. As OUT is LOW, Cin is HIGH. This keeps P4 OFF and N4 ON.

Hence general-purpose standards are supported using differential amplifiers without any static power dissipation. The hysteresis can also be implemented in differential amplifiers so that various standards can be supported with improved noise margin.

Figure 7:
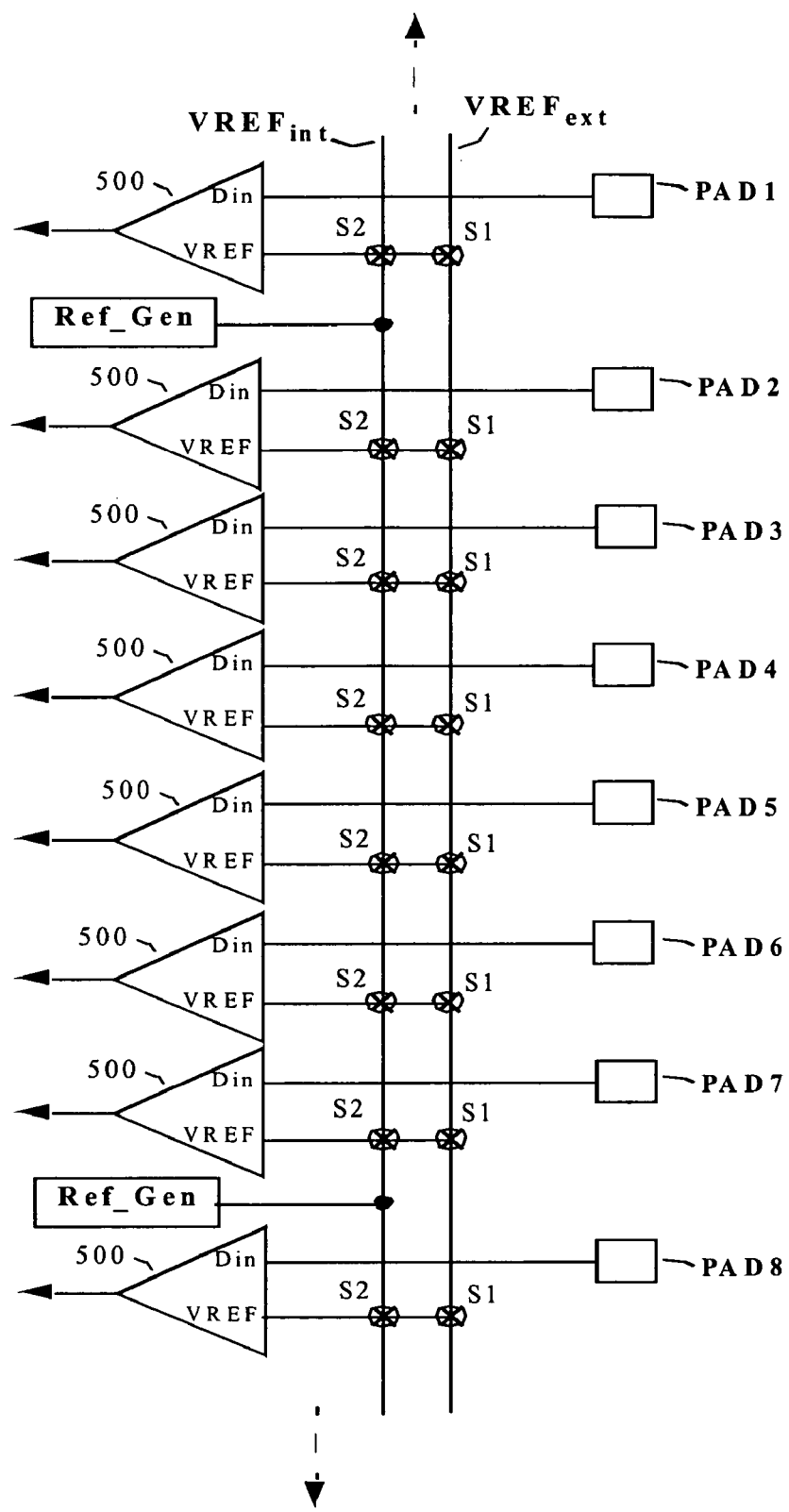
FIG. 7 shows the block diagram of a grouping of input buffers in accordance with the present invention.

For a FPGA to support general-purpose standards, the reference voltage VREF can be given externally like other high-speed standards. But for general-purpose standards, the external reference voltage would be incompatible and undesirable, so VREF is generated internally. We can use one reference voltage generation circuitry for a group of input receivers. FIG. 7 shows a group of input receivers 500 in which one reference generating circuitry Ref_Gen is used for every six receivers. Each receiver can be configured to receive the external reference VREFext or the internal reference VREFint through switches S1 and S2 respectively.

Figure 8A:
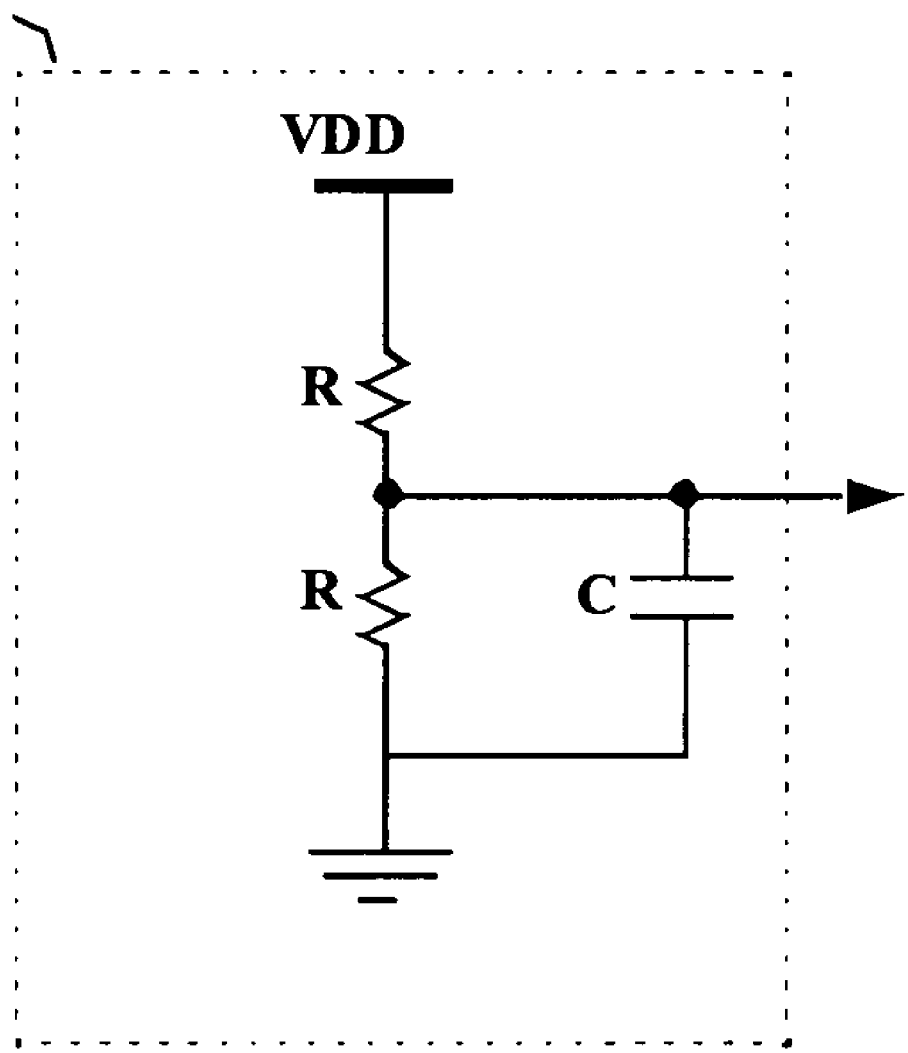
FIG. 8($a$) shows the circuit diagram of a basic reference voltage circuitry.

FIG. 8(a) shows the basic circuit Ref_Gen for reference voltage generation that is made up of resistances R and capacitor C. The variation in the reference voltage due to different processes and temperature conditions, generated through this circuitry is much smaller.

Figure 8B:
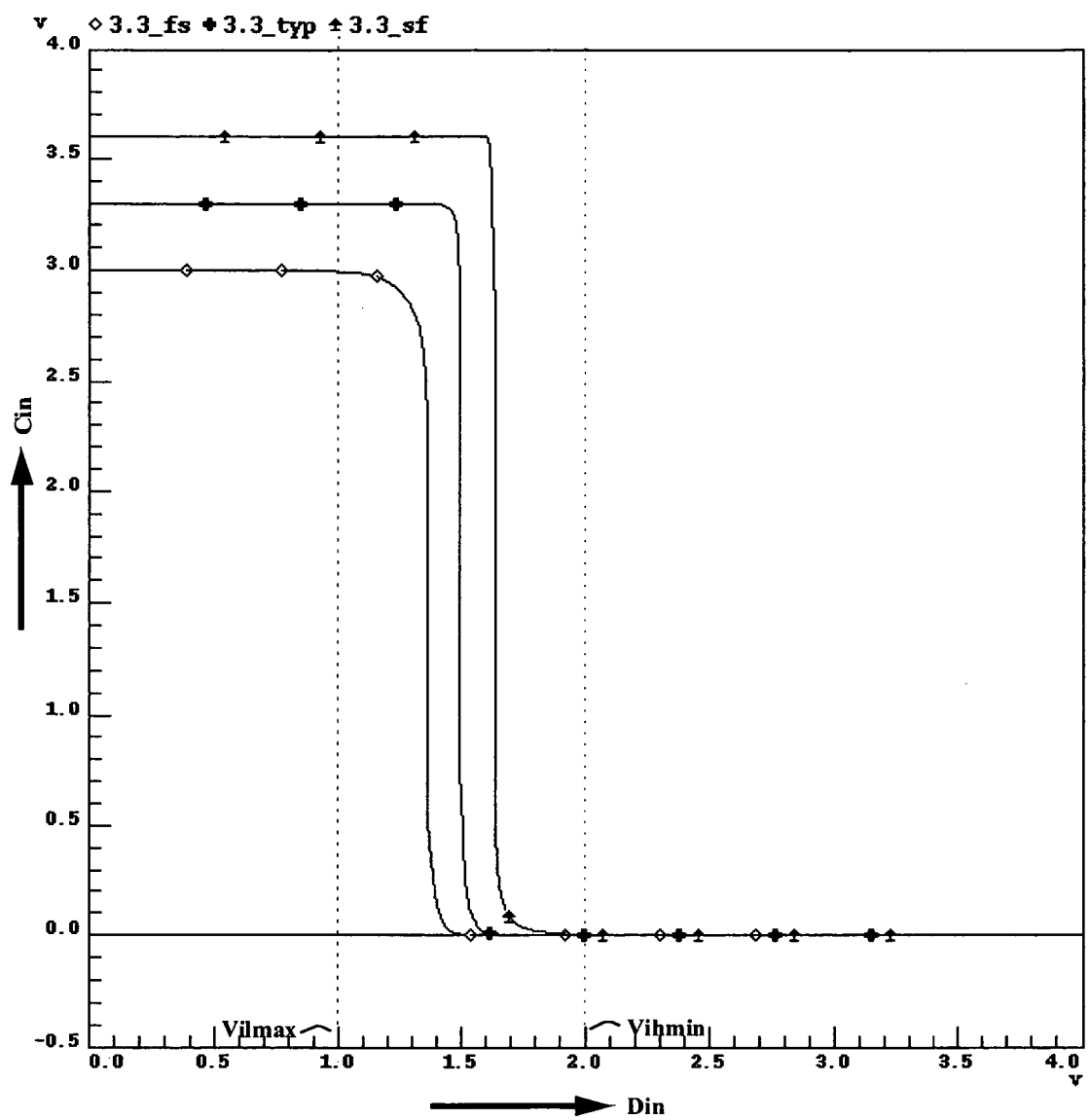
Figure 8C:
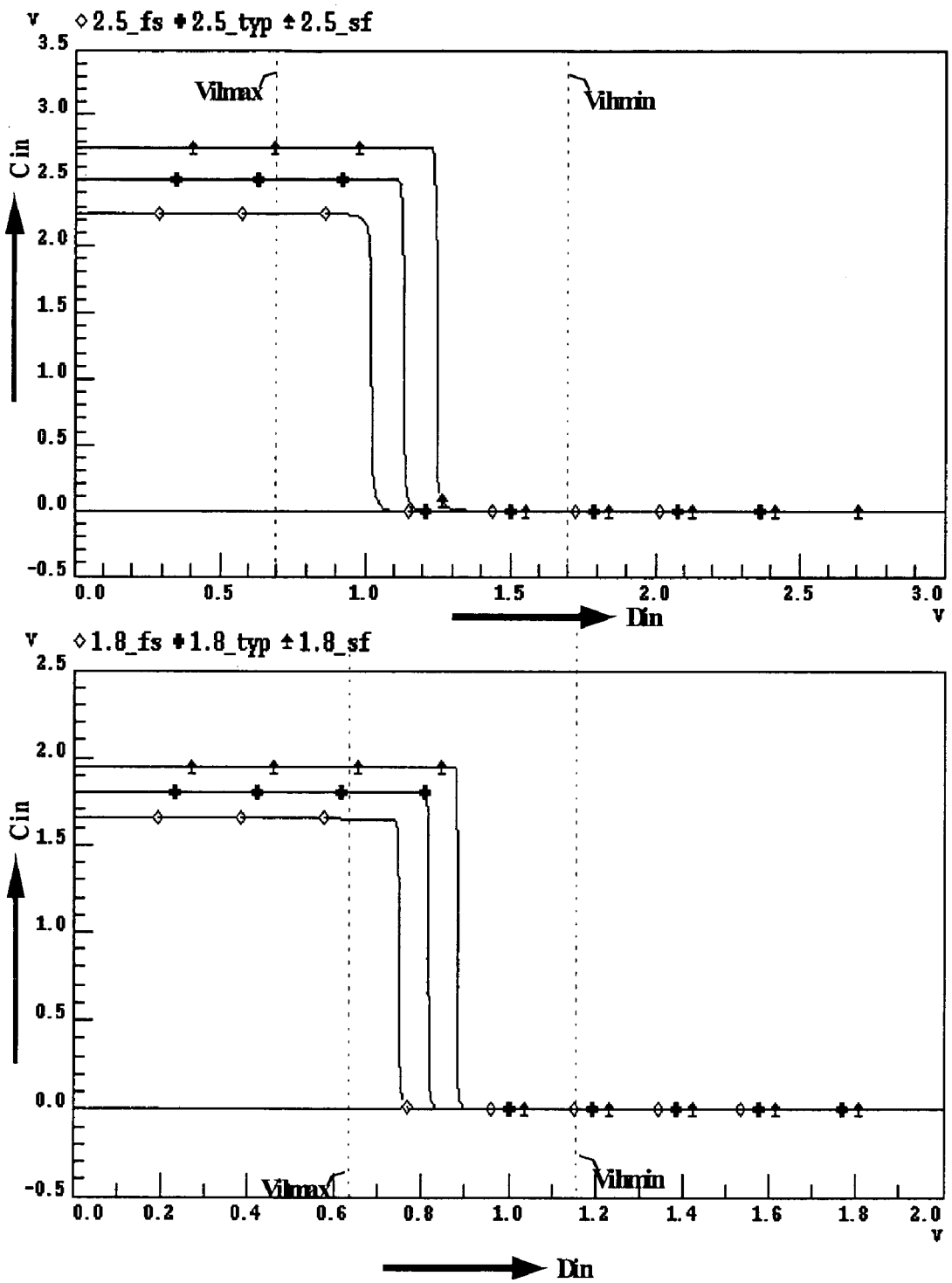
Figure 8D:
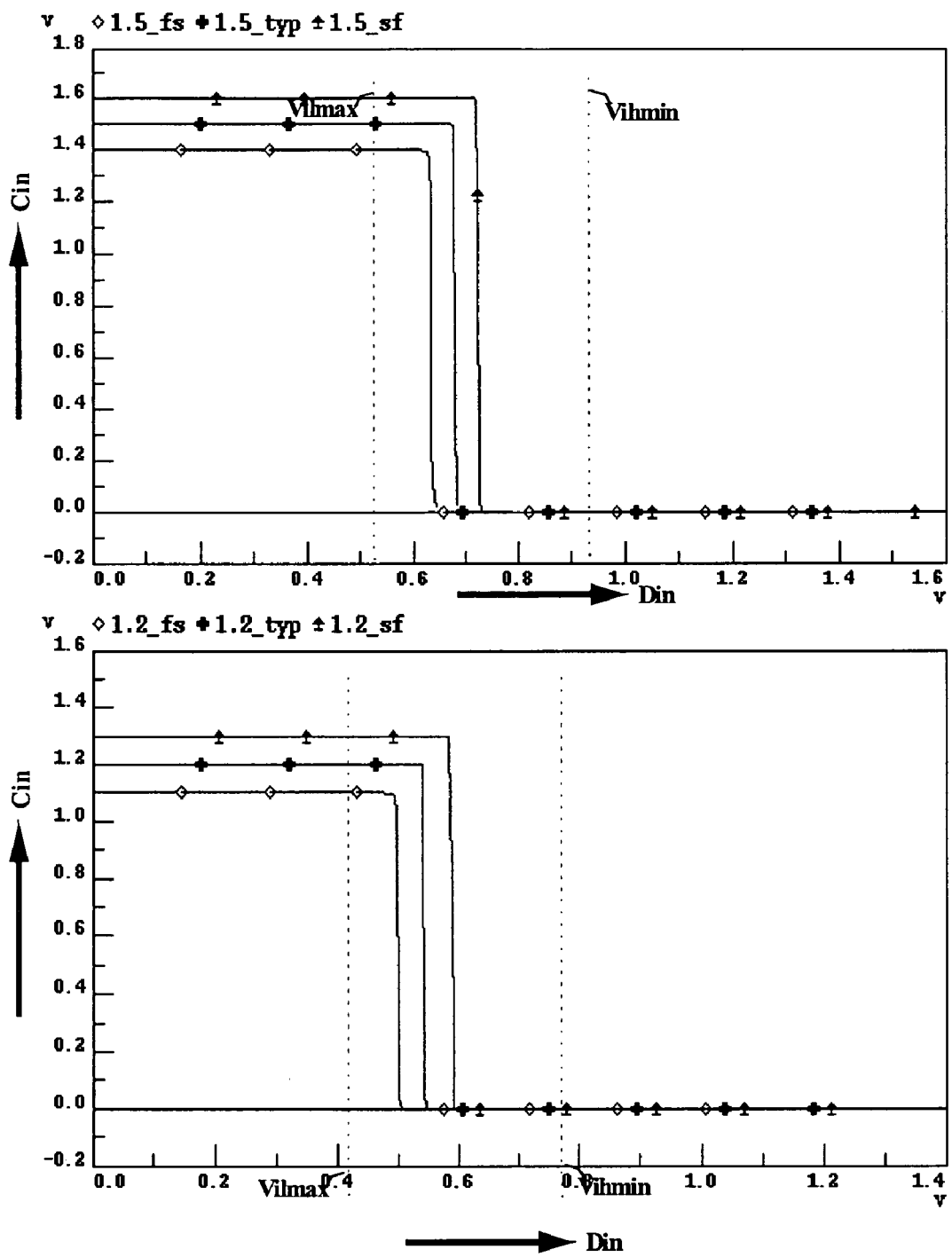

FIGS. 8(b) through 8(d) show the variation in trip point of the input buffer 500 with operating conditions for different general-purpose standards. All the characteristic curves of input buffer 500 are plotted for output Cin against input Din. Each figure has three curves, one at typical condition while the other two are at extreme conditions, SF (Slow models for NMOS, Fast Models for PMOS, temperature and power supply are best.) and FS (Fast models for NMOS, Slow models for PMOS and temperature and supply voltage are the worst). The Ref_Gen circuit of FIG. 8(a) is used to generate the reference voltage.

FIG. 8(b) shows the present invention input buffer's characteristic curves for nominal 3.3 volt supply voltage. In this case, the input buffer supports 5V CMOS, LVTTL and LVCMOS standards.

FIG. 8(c) shows the input buffer's characteristic curves for nominal 2.5V and 1.8V supply voltage supporting LVCMOS2 and LVCMOS1.8V standards respectively.

On other hand FIG. 8(d) shows the input buffer's characteristic curves for nominal 1.5V and 1.2V supply voltage supporting LVCMOS1.5 and LVCMOS1.2V IO standards respectively.

In all the cases the extreme curves are well within the $V_{ihmin}$ and $V_{ilmax}$ limits marked in the figures. Moreover, the variation in the trip point for different processes and conditions are much less compared to that in previous Schmitt triggers.

Figure 9:
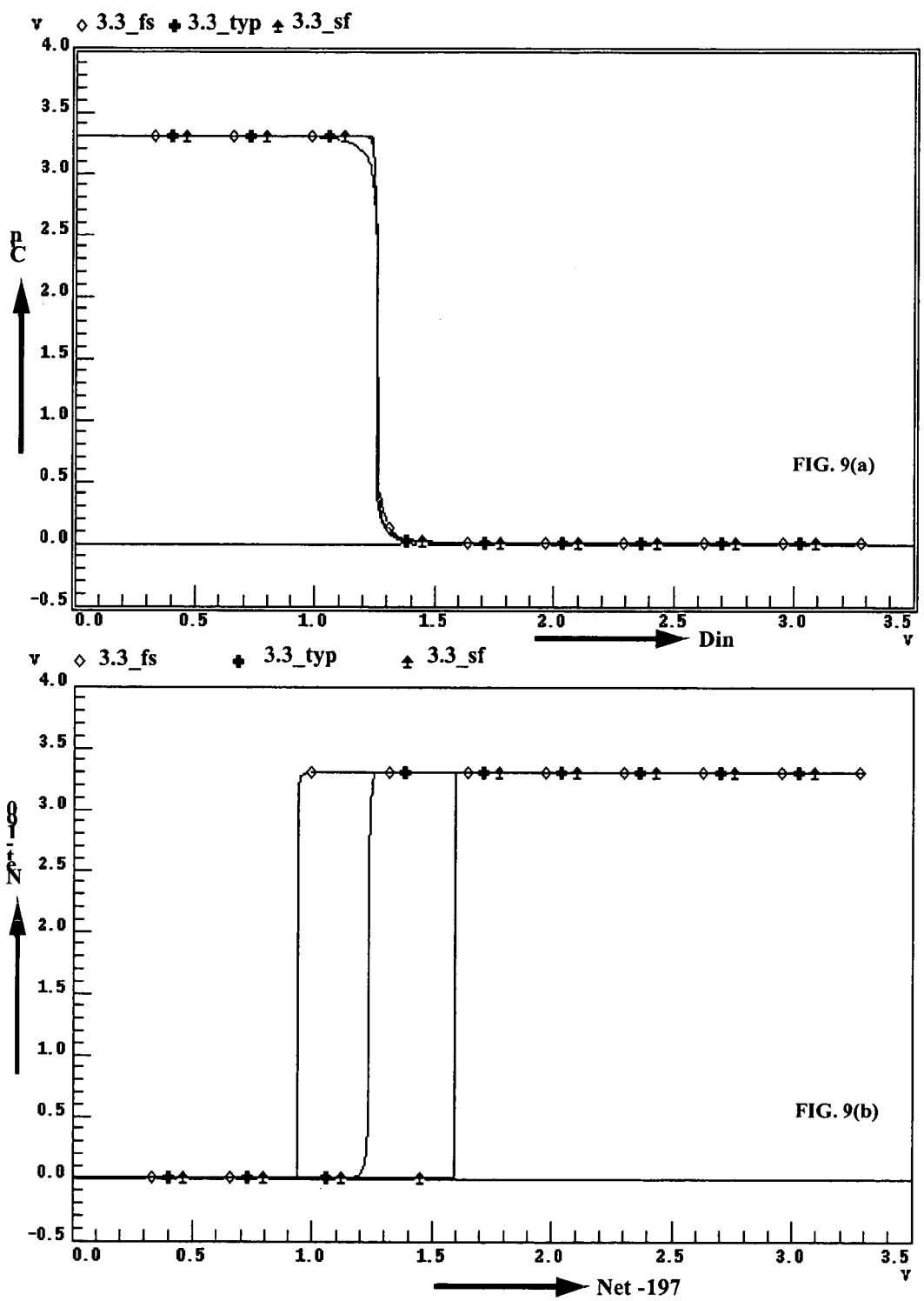
FIG. 9($a$) and FIG. 9($b$) show the comparison in the trip points of the present invention's input buffer and a known Schmitt trigger at extreme processes and temperature conditions respectively.

FIG. 9 shows the comparison in the trip points of the present invention's input buffer, which uses Ref_Gen circuitry for generating reference voltage VREF, and the previous Schmitt trigger at extreme processes and temperature conditions. For these curves, the supply voltage is a constant 3.3V. For one extreme SF, the models for NMOS are slow while the PMOS are fast and temperature is maximum, while for other extreme FS, the models for NMOS are fast while the PMOS are slow and the temperature is minimum. From the curves of the present invention input buffer 500, FIG. 9(a) and the previous Schmitt trigger FIG. 9(b), it is clear that the variation in the trip point of the input buffer of present invention is much less as compared to the variation in the trip point of the Schmitt trigger.

With this design, a Schmitt trigger can be eliminated in the input buffer architecture. This will reduce the layout area and also increase the frequency of operation since the differential comparator is used for TTL and CMOS standards. Moreover, the input receiver is very less susceptible to the different processes and temperature conditions as differential amplifiers are normally symmetrically designed.

It will be apparent that the use of internal reference voltage $VREF_{int}$ is not limited to general-purpose standards and can also be used for high-speed standards. In the present invention, instead of having a number of receivers in parallel, input receiver circuitry is made more versatile, and thus avoids the need of an output selection multiplexer. To support general-purpose standards, the differential amplifier does not directly replace the Schmitt trigger. Instead, a unique connectivity is provided within the differential amplifier to avoid static power dissipation.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims and the equivalent thereof.

We claim:

1. A CMOS input buffer supporting multiple I/O standards, comprising:
    a pair of NMOS and PMOS differential receivers each having a first input connected to the input pad and a second input connected to a reference voltage, the PMOS and NMOS differential receivers configured to support general purpose standards and to support high speed standards;
    a first multiplexer connected to a control terminal of a current sink of the NMOS differential receiver and having a first input connected to the positive supply terminal;
    a second multiplexer connected to the control terminal of the current source of the PMOS differential receiver and having a first input connected to a negative supply terminal or ground;
    an inverter connected to a combined output of said PMOS differential receiver and the NMOS differential receivers and having an output connected to a second input of the first and second multiplexer; and
    a configuration storage bit circuit coupled to the first and second multiplexer for selecting the inputs of the first and second multiplexer.

2. The CMOS input buffer supporting multiple I/O standards of claim 1 wherein the reference voltage is generated internally.

3. The CMOS input buffer supporting multiple I/O standards of claim 1 wherein the input buffer supports FPGA and other programmable devices.

4. The CMOS input buffer supporting multiple I/O standards of claim 1 wherein the PMOS and the NMOS differential receivers are configured to support general purpose standards to minimize static power dissipation and reduce susceptibility to different processes and conditions.

5. An input buffer, comprising:
a signal input to receive an input signal;
a reference voltage input to receive a reference voltage;
an output node to receive output signals;
a control circuit configured to generate a control signal to select whether the input buffer will support one of general purpose standards and high speed standards;
a first differential amplifier coupled to the signal input, to the reference input, and to the output node, and having a control input coupled to an output of the control circuit, and a feedback input coupled to an output terminal that is in turn coupled to the output node; and
a second differential amplifier coupled to the signal input, to the reference input, and to the output node, and having a control input coupled to an output of the control circuit, and a feedback input coupled to an output terminal that is coupled to the output node.

6. The input buffer of claim 5 wherein when the control signal is at a first level, the first and second differential amplifiers are configured to function as a conventional differential comparator to support high speed standards, and when the control signal is at a second level, the first and second differential amplifiers are configured to support general purpose interface standards.

7. The input buffer of claim 6 wherein when the control signal is at the first level and the input signal is at a voltage level greater than a voltage level of the voltage reference, the first differential amplifier is cut off and no static current will flow therethrough, and when the control signal is at the first level and the input signal has a voltage that is less than a voltage of the voltage reference, the second differential amplifier is cut off and no static current will flow therethrough.

8. The input buffer of claim 7 wherein the first differential amplifier comprises first and second NMOS devices having control terminals coupled to the signal input and the reference input, respectively, and source terminals coupled together to a drain of a third NMOS device, and a drain of the first NMOS device coupled to a gate of the third NMOS device and to gates of first and second PMOS devices, with the gates of the first and second PMOS devices connected to a gate of the third NMOS device and with sources of the first and second PMOS devices connected to a voltage source, and a fourth NMOS device having a drain coupled to a source of the third NMOS device, a source coupled to ground, and a gate coupled to an output of a first multiplexer, the first multiplexer having a control terminal coupled to the control input for receiving the control signal from the control circuit and a first input coupled to the voltage source and a second input coupled to the output terminal and configured to pass either a source voltage or an output signal from the output terminal in response to a level of the control signal.

9. The input buffer of claim 8 wherein the second differential amplifier comprises a third and a fourth PMOS device having gates coupled to the signal input and the reference input, respectively, and having drains coupled to drains of fifth and sixth NMOS devices, respectively, with the drain of the sixth NMOS device coupled to the output node; the fifth and sixth NMOS devices having gates coupled together to a drain of the fifth NMOS device and their sources coupled to ground, the third and fourth PMOS devices having sources coupled together to a drain of a fifth PMOS device, the fifth PMOS device having a gate coupled to the drain of the fifth NMOS device, and a source coupled to a source of a sixth PMOS device; the sixth PMOS device having a source coupled to the voltage source and a gate coupled to an output of a second multiplexer, the second multiplexer having a first input coupled to ground and a second input coupled to the output terminal and a control input coupled to the control circuit to receive the control signal.

10. The input buffer of claim 7, further comprising an output buffer coupled between the output node and the output terminal.

11. A method for supporting multiple I/O standards for a CMOS input buffer standards, the method comprising the steps of:
applying the input signal simultaneously to a first input of an NMOS differential receiver and a PMOS differential receiver;
supplying a reference voltage to the second input of each of the NMOS and said PMOS differential receiver;
combining and inverting the outputs of the NMOS and PMOS differential receivers;
multiplexing the control input of the current sink and current source of each of the NMOS and PMOS differential receiver between a supplied positive and negative supply voltage and said inverted output; and
selecting the supplied positive or negative supply voltage in case of high-speed interface, while selecting the inverted output for standard logic signal.

12. A method for interfacing various devices operating at varied interfacing standards and speeds, the method comprising:
receiving an input signal at first and second differential amplifiers;
receiving a reference voltage at each of the first and second differential amplifiers;
combining and inverting the outputs of the first and second differential amplifiers and feeding back the combined inverted outputs to the first and second differential amplifiers; and
generating a control signal to the first and second differential amplifiers to operate as a conventional differential comparator to support high speed standards when the control signal is at a first level and to operate as differential amplifiers in support of general interfacing standards for a standard logic signal when the control signal is at a second level.

13. The method of claim 12 wherein generating the control signal further comprises selecting a positive or negative voltage supply for the first and second differential comparators when the control signal is at the first level and selecting the inverted output when the control signal is at the second level.

14. A circuit for interfacing various devices operating at varied interfacing standards, including general standards and high speed standards, the circuit comprising:
at least one input buffer that includes first and second differential amplifiers each having a first input for receiving an input signal and a second input for receiving a reference voltage, and a control input for receiving a control signal, the first and second differential amplifiers functioning as a conventional differential comparator to support high speed standards in response to a control signal at a first level and configured to support general standards in response to the control signal at a second level;

wherein the at least one input buffer comprises an inverter receiving at an input an output signal from each of the first and second differential amplifiers and generating on an output an output signal of the at least one buffer; and wherein the at least one input buffer is configured to cut off the first differential amplifier and generate no static current when the control signal is at a first level and the input signal is greater than the voltage reference signal, and to cut off the second differential amplifier when the control signal is at the first level and the input signal is less than the voltage reference signal so that no static current flows through the second differential amplifier.

15. The circuit of claim 14 wherein each of the first and second differential amplifiers includes a multiplexer, the multiplexer of the first differential amplifier having a first input for receiving a voltage source and a second input for receiving a combination of output signals from the first and second differential amplifiers, and a control terminal for receiving the control signal, and the multiplexer of the second differential amplifier having a first input for receiving a ground reference voltage and a second input for receiving the combination of output signals from the first and second differential amplifiers, and a control input for receiving the control signal.

16. The circuit of claim 14 wherein the circuit is adapted to select a supplied positive or negative supply voltage in the case of high-speed interface, while selecting an inverted output for standard logic circuit.

17. An input buffer, comprising:
a first differential amplifier configured to receive an input signal and to generate an output signal;
a second differential amplifier configured to receive the input signal and to generate an output signal;
the first and second differential amplifiers configured to receive a control signal and to operate as a conventional differential comparator to support high speed I/O standards in response to the control signal at a first level and to support general I/O standards in response to the control signal at a second level; and
wherein the first and second differential amplifiers receive as input a feedback comprising a combination of the outputs of the first and second differential amplifiers, and whereby when the input signal is at a level greater than a voltage reference signal received at the first and second differential amplifiers, the first differential amplifier is cut off and no static current will flow therethrough, and when the control signal is at the first level and the input signal is less than the reference voltage, the second differential amplifier is cut off and no static current flows therethrough.

18. The buffer of claim 17 wherein the outputs of the first and second differential amplifiers are coupled to the input of an inverter, the inverter having an output that comprises an output of the buffer.

19. The circuit of claim 17 wherein the buffer is adapted to select a supplied positive or negative supply voltage in the case of high-speed interface, while selecting an inverted output for standard logic circuit.

20. A circuit for interfacing various devices operating at varied interfacing standards, including general standards and high speed standards, the circuit comprising:
at least one input buffer that includes first and second differential amplifiers each having a first input for receiving an input signal and a second input for receiving a reference voltage, and a control input for receiving a control signal, the first and second differential amplifiers functioning as a conventional differential comparator to support high speed standards in response to a control signal at a first level and configured to support general standards in response to the control signal at a second level; and
wherein each of the first and second differential amplifiers includes a multiplexer, the multiplexer of the first differential amplifier having a first input for receiving a voltage source and a second input for receiving a combination of output signals from the first and second differential amplifiers, and a control terminal for receiving the control signal, and the multiplexer of the second differential amplifier having a first input for receiving a ground reference voltage and a second input for receiving the combination of output signals from the first and second differential amplifiers, and a control input for receiving the control signal.

21. The circuit of claim 20 wherein the at least one input buffer comprises an inverter receiving at an input an output signal from each of the first and second differential amplifiers and generating on an output an output signal of the at least one buffer.

22. The circuit of claim 21 wherein the at least one input buffer is configured to cut off the first differential amplifier and generate no static current when the control signal is at a first level and the input signal is greater than the voltage reference signal, and to cut off the second differential amplifier when the control signal is at the first level and the input signal is less than the voltage reference signal so that no static current flows through the second differential amplifier.

* * * * *